(12) United States Patent
Hagiwara et al.

(10) Patent No.: US 6,197,475 B1
(45) Date of Patent: Mar. 6, 2001

(54) POSITIVE TYPE PHOTOSENSITIVE RESIN COMPOSITION CONTAINING AN ALKALI-SOLUBLE POLYMER AND A COMPOUND WHICH FORMS AN AMINE COMPOUND WITH IRRADIATION OF LIGHT

(75) Inventors: Hideo Hagiwara; Makoto Kaji; Yasunori Kojima, all of Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 08/234,861

(22) Filed: Apr. 28, 1994

(30) Foreign Application Priority Data

Apr. 28, 1993 (JP) .................................................. 5-102482

(51) Int. Cl.$^7$ ...................................................... G03F 7/32
(52) U.S. Cl. ................................... 430/270.1; 430/283.1; 430/284.1; 430/326; 430/919; 522/65
(58) Field of Search .................................. 430/270, 283, 430/284, 326, 919, 270.1, 283.1, 284.1; 522/65

(56) References Cited

U.S. PATENT DOCUMENTS

| 4,515,887 | * | 5/1985 | Davis | 430/283 |
| 5,114,826 | * | 5/1992 | Kwong et al. | 430/270 X |
| 5,206,117 | * | 4/1993 | Labadie et al. | 430/270 X |
| 5,385,808 | * | 1/1995 | Tokoh et al. | 430/283 |

FOREIGN PATENT DOCUMENTS

| 0425142 |   | 5/1991 | (EP) . |
| 0502400 | * | 9/1992 | (EP) . |
| 0532183 |   | 3/1993 | (EP) . |
| 0555749 |   | 8/1993 | (EP) . |

OTHER PUBLICATIONS

Winkle et al. "Acid Hardening Positive Photoresist Using Photochemical Generation of Base", 3 J. Photopolymer Sci. & Tech. 419–422 (1990).*

Database WPI, Section Ch, Week 9129, Derwent Publications Ltd., London, GB; Class A89 An 91–212618.

* cited by examiner

Primary Examiner—Mark Chapman
(74) Attorney, Agent, or Firm—Antonelli, Terry, Stout & Kraus, LLP.

(57) ABSTRACT

There is disclosed a positive type photosensitive resin composition which comprises an alkali-soluble polymer (A) having a carboxyl group and/or a phenolic hydroxyl group, and a compound (B) which forms an amine compound with irradiation of light.

16 Claims, No Drawings

POSITIVE TYPE PHOTOSENSITIVE RESIN COMPOSITION CONTAINING AN ALKALI-SOLUBLE POLYMER AND A COMPOUND WHICH FORMS AN AMINE COMPOUND WITH IRRADIATION OF LIGHT

BACKGROUND OF THE INVENTION

1. Field of the Invention

This invention relates to a photosensitive resin composition, more specifically to a photosensitive resin composition having an excellent film property, heat-resistance, adhesivity and image-formability which does not require complex steps for preparation and does not cause contamination with chlorides.

2. Prior Art

In the semiconductor industries, inorganic materials have conventionally been used for interlaminar insulation. Recently, organic materials having an excellent heat-resistance such as a polyimide resin have been put to use as materials for interlaminar insulation because of properties thereof.

A process for forming a pattern in a semiconductor integrated circuit or forming a pattern of a circuit of a print substrate comprises complex and various steps such as formation of a resist material film on the substrate surface; exposure of required portion to light; removal of unnecessary portion by etching or so; and washing of the base surface. Therefore, development of heat-resistant photosensitive materials have been desired, which enables the required portion of the resist material to be used as insulating materials even after the pattern is formed by exposure to light and development.

As such a material, heat-resistant photosensitive materials comprising, for example, a photosensitive polyimide or a cyclized polybutadiene as a base polymer have been proposed. The photosensitive polyimide has attracted attentions since it has an excellent heat-resistance and impurities can easily be removed.

As such a photosensitive polyimide, for example, a photosensitive polyimide precursor (a polyamic acid ester) in which a photosensitive group is introduced into the polyimide precursor by an ester bond is proposed in Japanese Patent Publication No. 30207/1980. This material which requires the use of an acid chloride group in synthesis of the photosensitive polyimide precursor has a disadvantage that a finally obtained photosensitive resin composition is easily contaminated with the chloride. Also, thermal cure of the polyamic acid ester to obtain the objective polyimide requires a high temperature, and therefore, the polyamic acid ester cannot be used when an element which cannot be heated at a high temperature is used.

As another example, a photosensitive resin composition which mainly comprises a mixture of a polyamic acid, an amine having a photoactive functional group and an azide compound as a photosensitizer is proposed in Japanese Provisional Patent Publication No. 168942/1982.

However, the photosensitive resin composition has a disadvantage that a thick film thereof cannot be formed.

Japanese Provisional Patent Publication No. 95697/1979 proposes a photosensitive resin composition which mainly comprises a mixture of a polyamic acid and a polymerizable unsaturated compound having a photoactive functional group. This photosensitive resin composition, however, has a disadvantage that it has a lower resolution as compared with a photosensitive resin composition which uses a photosensitive group-containing polyamic acid in which the photosensitive group is directly bound with the polyamic acid.

SUMMARY OF THE INVENTION

The present invention is to overcome the above described problems of the prior arts, and it is an object of the present invention to provide a photosensitive resin composition having an excellent film property, heat-resistance, adhesions and image-formability which does not require complex steps for preparation and does not cause contamination with chlorides.

The present invention relates to a positive type photosensitive resin composition which comprises an alkali-soluble polymer (A) having a carboxyl group and/or a phenolic hydroxyl group, and a compound (B) which forms an amine compound with irradiation of light.

DESCRIPTION OF THE PREFERRED EMBODIMENT

In the following, the present invention is explained in detail.

The alkali-soluble polymer (A) of the present invention is a polymer having an acidic group such as a carboxyl group, a sulfonic acid group and/or a phenolic hydroxyl group capable of forming a salt with a basic compound mentioned below and is not particularly limited, and may include, for example, a polyamic acid resin, a solvent-soluble polyimide resin having at least one of a carboxy group and a phenolic hydroxy group, and a phenol novolak resin. Among them, the polyamic acid resin is preferred, and the polyamic acid resin having recurring units represented by the formula:

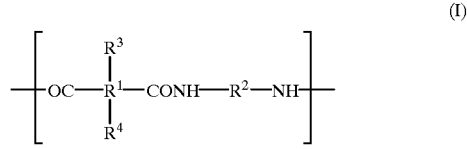

wherein $R^1$ represents a tetravalent group may have one or more substituents, $R^2$ represents a divalent group which may have one or more substituents; $R^3$ and $R^4$ are in the ortho-position of one of two carbonyl groups, respectively, and each independently represent a hydrogen atom or a carboxyl group, provided that at least one of which is a carboxyl group, is more preferred.

In the formula (I), the tetravalent group of $R^1$ may include, for example, the following groups:

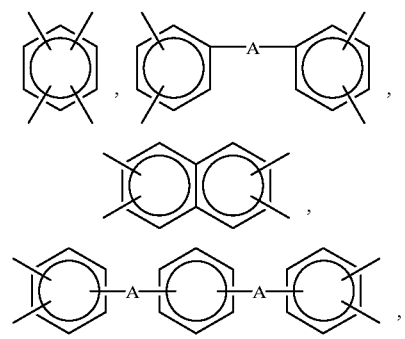

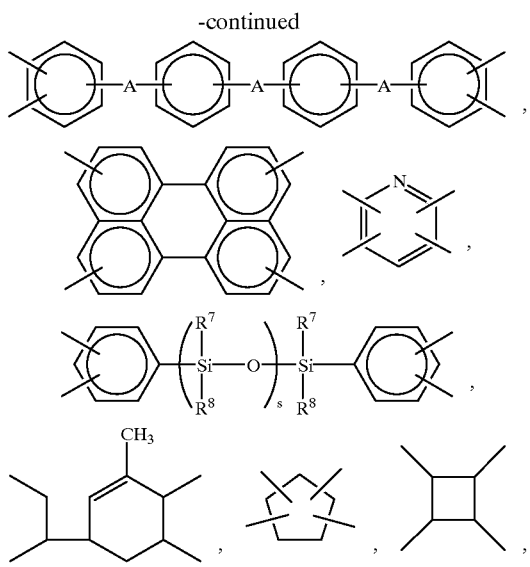

and the hydrogenated groups thereof, wherein A represents

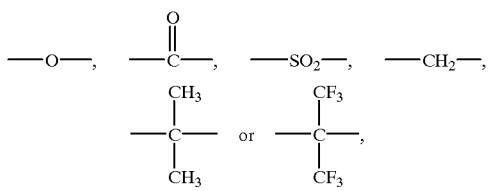

sulfur atom or a direct linkage, each A is the same or different, $R^7$ and $R^8$ may be the same or different from each other and each represents an alkyl group having 1 to 10 carbon atoms, a cycloalkyl group having 3 to 8 carbon atoms, an aryl group having 6 to 14 carbon atoms or an aralkyl group having 7 to 17 carbon atoms, and s represents 0 or an integer of 1 or more, and the divalent group of $R_2$ may include, for example, the following groups:

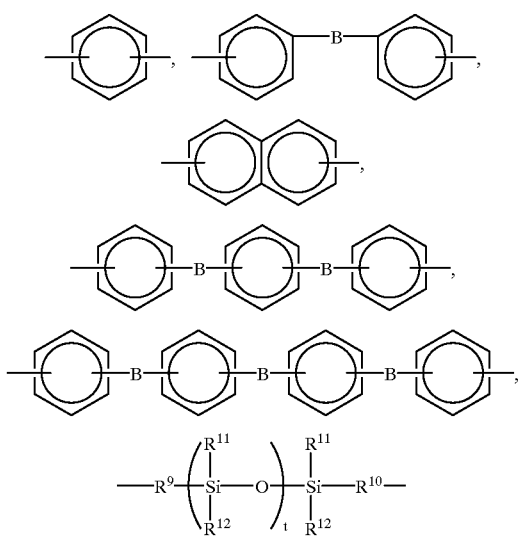

and the hydrogenated groups thereof, wherein B has the same meaning as A, each B is the same or different, $R^9$ and $R^{10}$ may be the same or different from each other and each represents an alkylene group having 1 to 10 carbon atoms, a cycloalkylene group having 3 to 8 carbon atoms, an arylene group having 6 to 14 carbon atoms or an aralkylene group having 7 to 17 carbon atoms, $R^{11}$ and $R^{12}$ may be the same or different from each other and each represents an alkyl group having 1 to 10 carbon atoms, a cycloalkyl group having 3 to 8 carbon atoms, an aryl group having 6 to 14 carbon atoms or an aralkyl group having 7 to 17 carbon atoms, and t represents an integer of 1 or more.

The aromatic rings of the above tetravalent groups may have one or more substituents such as alkyl groups having 1 to 6 carbon atoms and alkoxy groups having 1 to 6 carbon atoms.

The aromatic rings of the above divalent groups may have one or more substituents such as alkyl groups having 1 to 6 carbon atoms, alkoxy groups having 1 to 6 carbon atoms and hydroxyl groups.

$R^3$ and $R^4$ exist at the ortho-position relative to one of the carbonyl groups bonded to $R^1$, and at least one of which is a carboxyl group and the other is a hydrogen atom or a carboxyl group.

The polyamic acid resin preferably has a number average molecular weight of 3,000 to 200,000, more preferably 5,000 to 100,000, most preferably 7,000 to 50,000.

If the number average molecular weight is too low, the mechanical property is lowered. If the number average molecular weight is too high, the resolution is lowered.

The polyamic acid resin having the recurring units represented by the formula (I) can be prepared by reacting, for example, a tetracarboxylic dianhydride as an acidic component and a diamine as an amine component in an organic solvent.

In such a case, the group represented by $R^1$ and $R^2$ in the formula (I) represents an acidic component residue as for $R^1$ and an amine component residue as for $R^2$.

As the above tetracarboxylic dianhydride, for example, pyrromellitic dianhydride, 3,3',4,4'-benzophenonetetracarboxylic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 1,4,5,8-naphthalenetetracarboxylic dianhydride, 3,4,9,10-perylene tetracarboxylic dianhydride, 4,4'-sulfonyldiphthalic dianhydride, m-terphenyl-3,3",4,4"-tetracarboxylic dianhydride, p-terphenyl-3,3",4,4"-tetracarboxylic dianhydride, 4,4'-oxydiphthalic anhydride, 1,1,1,3,3,3-hexafluoro-2,2-bis-(2,3- or 3,4-dicarboxyphenyl)propane dianhydride, 2,2-bis-(2,3- or 3,4-dicarboxyphenyl)propane dianhydride, 2,2-bis-[4-(2,3- or 3,4-dicarboxyphenoxy)phenyl]propane dianhydride, 1,1,1,3,3,3-hexafluoro-2,2-bis [4-(2,3- or 3,4-dicarboxyphenoxy)phenyl]propane dianhydride, another aromatic tetracarboxylic dianhydride such as tetracarboxylic dianhydride represented by the formula (III):

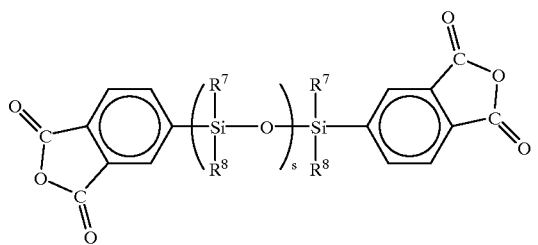

(III)

wherein $R^7$ and $R^8$ may be the same or different from each other and each represents a monovalent hydrocarbon group such as an alkyl group having 1 to 10 carbon atoms, a cycloalkyl group having 3 to 8 carbon atoms, an aryl group having 6 to 14 carbon atoms or an aralkyl group having 7 to 17 carbon atoms; and s represents 0 or an integer of 1 or more, a hydrogenated compound of the above aromatic tetracarboxylic dianhydride, and an alicyclic tetracarboxylic dianhydride represented by the following formulae (IV):

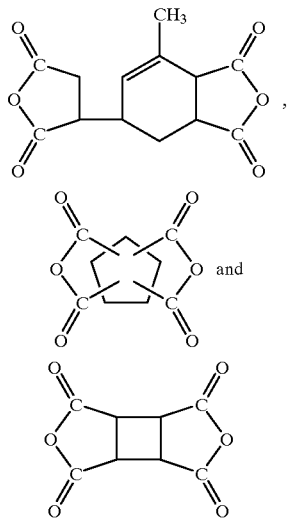

(IV)

can preferably be used.

The above tetracarboxylic dianhydride can be used singly or in combination. The compound of the formula (III) may preferably be used in an amount of 1 to 30 mole %, more preferably 2 to 10 mole % based on the total acid components, and the compounds of the formulae (IV) may preferably be used in an amount of 5 to 50 mole %, more preferably 5 to 20 mole % based on the same. Among them, the aromatic tetracarboxylic dianhydride is most preferred. The benzene ring of the tetracarboxylic dianhydride may be substituted by a substituent such as an alkyl group having 1 to 6 carbon atoms or an alkoxyl group having 1 to 6 carbon atoms. In addition to the above-mentioned tetracarboxylic dianhydride, an aliphatic tetracarboxylic dianhydride may be used to such an extent that the heat-resistance and the mechanical property are not lowered.

As the above diamine, there can be preferably used, for diamino compound such as p-phenylene diamine, m-phenylenediamine, p-xylylenediamine, m-xylylenediamine, 1,5-diaminonaphthalene, 3,3'-dimethylbenzidine, 3,3'-dimethoxybenzidine, 4,4'- (or 3,4'-, 3,3'-, 2,4'- or 2,2'-)diaminodiphenylmethane, 4,4'- (or 3,4'-, 3,3'-, 2,4' or 2,2'-)diaminodiphenyl ether, 4,4'- (or 3,4'-, 3,3'-, 2,4'- or 2,2'-)diaminodiphenylsulfone, 4,4'- (or 3,4'-, 3,3'-, 2,4'- or 2,2'-)diaminodiphenylsulfide, 4,4'-benzophenonediamine, 4,4'-di(4-aminophenoxy) phenylsulfone, 1,1,1,3,3,3-hexafluoro-2,2-bis(4-aminophenyl)propane, 2,2-bis[4-(4-aminophenoxy)phenyl] propane, 3,3'-dimethyl-4,4'diaminodiphenylmethane, 3,3',5, 5'-tetramethyl-4,4'-diaminodiphenylmethane, 4,4'-di(3-aminophenoxy)phenylsulfone, 3,3'-diaminodiphenylsulfone and 2,2-bis(4-aminophenyl)propane; and an alicyclic diamino compound which is a hydrogenated compound of the above aromatic diamino compounds.

Also, another diamino compound represented by the formula (V):

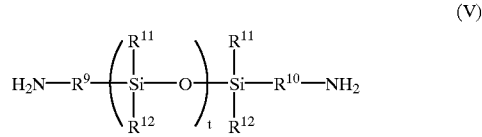

(V)

wherein $R^9$ and $R^{10}$ represent a divalent hydrocarbon group such as an alkylene group having 1 to 10 carbon atoms, a cycloalkylene group having 3 to 8 carbon atoms, an arylene group having 6 to 14 carbon atoms or an aralkylene group having 7 to 17 carbon atoms; $R^{11}$ and $R^{12}$ represent a monovalent hydrocarbon group such as an alkyl group having 1 to 10 carbon atoms, a cycloalkyl group having 3 to 8 carbon atoms, an aryl group having 6 to 14 carbon atoms or an aralkyl group having 7 to 17 carbon atoms; $R^9$ and $R^{10}$; $R^{11}$ and $R^{12}$ each may be the same or different; and t represents an integer of 1 or more, may be used in combination with the above diamine compounds. The above diamino compound represented by the formula (V) may preferably be used in an amount of 1 to 30 mole %, more preferably 2 to 10 mole % based on the total amount of diamine compounds.

Also as the diamine, a hydroxyl group-containing diamine such as 3,3'-hydroxybenzidine, 3,4'-diamino-3',4-dihydroxy-biphenyl, 3,3'-dihydroxy-4,4'-diaminodiphenyl oxide, 3,3'-dihydroxy-4,4'-diaminodiphenylsulfone, 2,2-bis (3-amino-4-hydroxyphenyl)propane, 1,1,1,3,3,3-hexafluoro-2,2-bis-3-amino-4-hydroxyphenyl)propane, bis-(3-hydroxy-4-aminophenyl)methane, 3,3'-dihydroxy-4,4'-diaminobenzophenone, 1,1-bis-(3-hydroxy-4-aminophenyl) ethane, 2,2-bis-(3-hydroxy-4-aminophenyl)propane, 1,1,1, 3,3,3-hexafluoro-2,2-bis-(3-hydroxy-4-aminophenyl) propane, 1,3-diamino-4-hydroxybenzene, 1,3-diamino-5-hydroxybenzene, 1,3-diamino-4,6-dihydroxybenzene, 1,4-diamino-2-hydroxybenze and 1,4-diamino-2,5-dihydroxybenzene can preferably be used.

The diamine may be used singly or in combination.

As the organic solvent usable in the above reaction, a polar solvent which completely dissolves the forming polyamic acid resin is generally preferred, and there may be mentioned, for example, N-methyl-2-pyrrolidone, N,N-dimethylacetamide, N,N-dimethylformamide, dimethylsulfoxide, tetramethylurea, hexamethylphosphoric triamide and β-butyrolactone.

In addition to these polar solvents, ketones, esters, lactones, ethers, halogenated hydrocarbons and hydrocarbons, for example, acetone, methyl ethyl ketone, methyl isobutyl ketone, cyclohexanone, methyl acetate, ethyl acetate, butyl acetate, diethyl oxalate, dimethyl malonate, γ-butyrolactone, diethyl ether, ethyleneglycol dimethyl ether, diethyleneglycol dimethyl ether, tetrahydrofurane, dichloromethane, 1,2-dichloroethane, 1,4- dichloroethane, trichloroethane, chlorobenzene, o-dichlorobenzene, hexane, heptane, octane, benzene, toluene and xylene can also be used.

The organic solvent may be used singly or in combination.

The compound (B) of the present invention which forms an amine compound with irradiation of light is not particularly limited, and a compound represented by the formula (II):

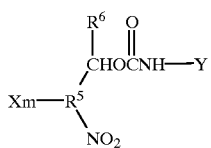
(II)

wherein $R^5$ represents an aromatic ring group; $R^6$ represents a hydrogen atom or a monovalent organic group; X represents a hydrogen atom or a monovalent substituent, Y represents a monovalent organic group; m represents an integer of 1 through 5, and when m is two or more, a plural number of X's may be the same or different, can preferably be used.

The aromatic ring represented by $R^5$ is not particularly limited, and benzene (phenylene), naphthalene and anthracene rings are preferred.

The monovalent organic group represented by $R^6$ is not particularly limited, and an alkyl group having 1 to 6 carbon atoms, preferably 1 to 3 carbon atoms is preferred.

The monovalent substituent represented by X is not particularly limited, and an alkyl group having 1 to 10 carbon atoms, an alkoxyl group having 1 to 10 carbon atoms, a halogen atom, a nitro group and a cyano group are preferred.

Especially, the compound (B) having at least one methoxy group as a monovalent substituent represented by X is expected to provide an excellent sensitivity.

The monovalent organic group represented by Y is not particularly limited, and an alkyl group having 1 to 10 carbon atoms, preferably 1 to 4 carbon atoms, a cycloalkyl group having 3 to 8 carbon atoms, preferably 3 to 6 carbon atoms, an aralkyl group having 7 to 17 carbon atoms, preferably 7 to 12 carbon atoms, and a hydroxyalkyl group having 1 to 10 carbon atoms, preferably 1 to 6 carbon atoms are preferred.

Especially, the compound (B) having a hydroxyethyl group as a monovalent organic group represented by Y is expected to provide more excellent resolution.

A process for preparation of the compound (B) represented by the formula (II) is not particularly limited, and can be carried out, for example, when the aromatic ring of $R^5$ in the formula (II) is a benzene ring, by reacting a benzylalcohol derivative and an isocyanate compound as shown by the formula (VI):

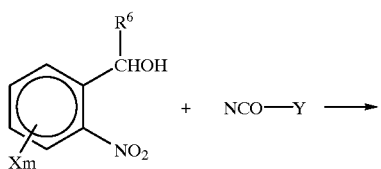
(VI)

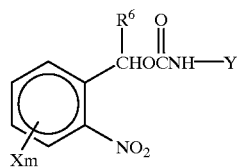

wherein $R^6$, X, Y and m have the same meaning as in the formula (II).

In the reaction, a catalyst may be used if necessary.

The compound represented by the formula (II) may include, for example, the following compounds:

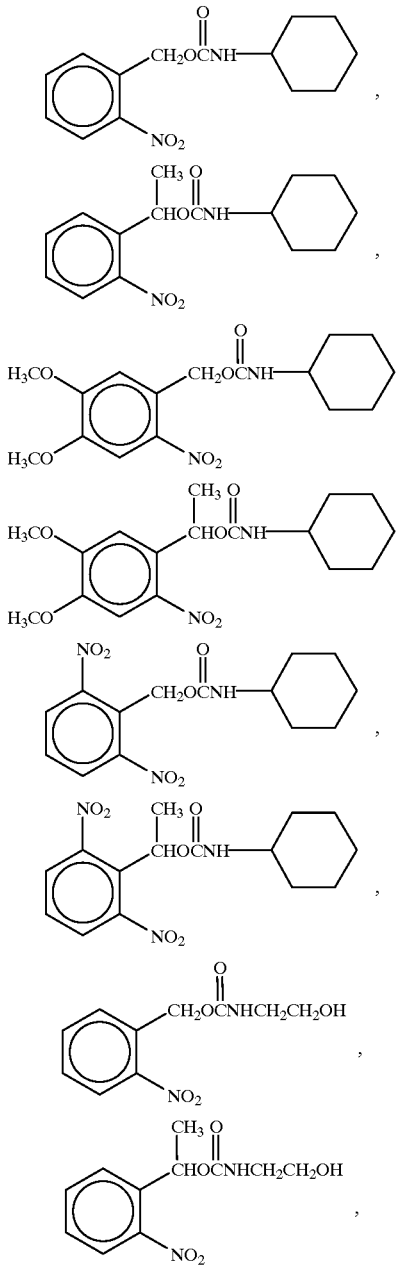

-continued

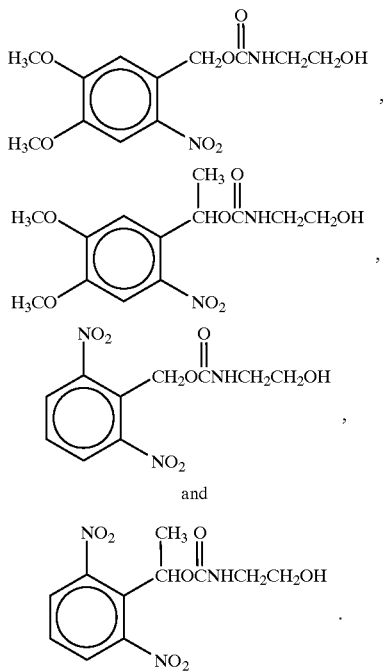

In the present invention, it is particularly preferred to use the compound (A) wherein $R^1$ is

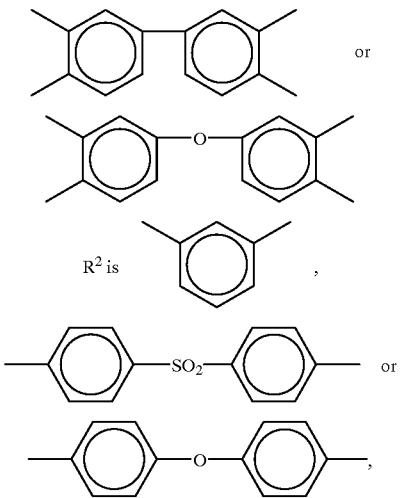

and $R^3$ and $R^4$ are both —COOH groups.

Also, it is particularly preferred to use the compound (B) wherein $R^5$ is

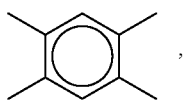

$R^6$ is —CH$_3$, X is —OCH$_3$, m is 2 and Y is —CH$_2$CH$_2$OH or a cyclohexyl group.

The photosensitive resin composition of the present invention can be obtained by mixing an alkali-soluble polymer (A) and the compound (B).

The present invention can be accomplished by using not only a polyamic acid resin but also a solvent-soluble polyimide resin having at least one of a carboxyl group and phenolic hydroxy group and phenol novolak resin as an alkali-soluble polymer (A). The above solvent means an organic solvent used for a reaction producing a polyamic acid resin.

In the photosensitive resin composition of the present invention, the compound (B) may preferably be used in the range of 1 to 250% by weight, more preferably in the range of 50 to 170% by weight based on the polymer (A).

A coupling agent or a surfactant may be added to the photosensitive resin composition of the present invention in order to improve the adhesions to the substrate, if necessary.

The photosensitive resin composition of the present invention contains the above described various components. The solid content of a coating solution containing said composition is preferably 5 to 50% by weight, more preferably 10 to 30% by weight, and the viscosity of the coating solution is preferably 1 to 300 poise, more preferably 30 to 200 poise. The order for mixing these components and the method for mixing these components are not particularly limited, and the composition may be applied to a substrate such as a copper-clad laminate and a silicon wafer by a dipping method, a spraying method, a screen printing method and a spinner coating method, and dried to form a film.

Also, a dry film having a sandwich structure may be previously prepared by coating a flexible substrate, for example, a polyester film, with the photosensitive resin composition; drying it to laminate thereon; and then covering the laminate with a cover sheet made of polyethylene or the like, and a film can be prepared on the substrate to be covered by peeling the cover sheet of the dry film.

The cover sheet may not necessarily be used.

By irradiating active rays on the film through a mask having required pattern, an amine compound originating from the component (B) generates at the portion of irradiation (exposed portion). The irradiated portion becomes water soluble in the presence of the amine compound, whereas the non-irradiated portion (non-exposed portion) remains water-insoluble.

As the above active rays, ultraviolet rays or visible rays are usually used. In some cases, a film can be formed similarly by irradiating ionizing radiation such as en electronic ray and a radiation.

By treating the surface of thus treated film, with water as a developer, the irradiated portion which is made water-soluble in the presence of the amine compound can be removed, and the non-irradiated portion, which is insoluble, remains so that the required resin pattern can be obtained.

As the developer usable in the present invention, water can usually be used as above. In addition, an organic solvent, a mixed solvent of a water-soluble organic solvent and water and/or an alkali aqueous solution can be used.

The organic solvent may include, for example, N-methyl-2-pyrrolidone, N-acetyl-2-pyrrolidone, N,N-dimethylformamide, N,N-dimethylacetamide, dimethylsulfoxide, hexamethylene-phosphoric triamide, γ-butyrolactone, an alcohol such as methanol, ethanol and isopropanol, an aromatic hydrocarbon compound such as toluene and xylene, a ketone such as acetone, methyl ethyl ketone and methyl isobutyl ketone, an ester such as ethyl acetate and methyl propionate, and an ether such as tetrahydrofurane and dioxane.

The alkali aqueous solution is a solution of a basic compound dissolved in water. As the basic compound, for example, a hydroxide, a carbonate, a hydrogencarbonate, a silicate, a phosphate, a pyrophosphate, an acetate and an amine of an alkaline metal or a quaternary ammonium can be used. As the concrete example, there may be mentioned lithium hydroxide, sodium hydroxide, potassium hydroxide, ammonium hydroxide, trimethylbenzylammonium hydroxide, tetramethylammonium hydroxide, sodium carbonate, potassium carbonate, sodium hydrogencarbonate, sodium silicate, sodium phosphate, sodium pyrophosphate, sodium acetate, monoethanolamine, diethanolamine and triethanolamine.

The amount of the basic compound based on the amount of water is preferably such an amount that the sufficient difference in the solubility or in the dissolution rate is caused between the irradiated portion and the non-irradiated portion.

Thus obtained pattern can be converted to a surface protective film or an interlaminar insulating film of a semiconductor, a multi-layer printed-wiring board and a high density packaging substrate each having a heat resistance by preliminarily drying at 50 to 250° C., and then heating, i.e., post-curing at 300 to 400° C. The photosensitive resin composition of the present invention is remarkably useful mainly in the above mentioned field of fine processing.

EXAMPLES

The present invention is described in detail by referring to Examples, but the scope of the invention is not limited by these Examples.

Example 1
Synthesis of Polyamic Acid Resin

In a 100 ml separable flask with a stirrer, a thermometer and an inlet for introducing dry nitrogen gas, 7.8092 g (0.039 mol) of diaminodiphenyl ether (hereinafter abbreviated to as "DDE") was added to 75.4 g of N-methyl-2-pyrrolidone (hereinafter abbreviated to as "NMP") to dissolve it therein while stirring under the atmosphere of nitrogen. To the amine solution, 17.3253 g (0.039 mol) of 1,1,1,3,3,3-hexafluoro-2,2-bis-(3,4-dicarboxyphenyl) propane dianhydride (hereinafter abbreviated to as "6-FDA") was added, and the mixture was reacted at room temperature for 8 hours to have a viscous solution of a polyamic acid resin (hereinafter abbreviated to as "PA-1").
Preparation of Photosensitive Resin Composition 1-(2-Nitrophenyl)ethyl-N-cyclohexylcarbamate in an amount of 3 g and 0.5 g of polyethyleneglycol were added to 10 g of the above synthesized polyamic acid resin solution (PA-1), and dissolved therein while stirring, followed by filtration with a 5 μm filter to have a photosensitive resin composition.
Evaluation A silicon wafer was spin-coated with the above prepared photosensitive resin composition, and pre-baked at 100° C. for 300 seconds to have a uniform film having a thickness of 5 μm.

Then, the film was irradiated with an ultrahigh pressure mercury lamp (20 mW/cm$^2$) for 100 seconds through a mask. The film was then dipped in water to carry out a development, rinsed with water, and dried so that a positive type clear relief pattern having a high resolution was obtained. The relief pattern was thermally cured at 100° C. for 30 minutes, at 200° C. for 60 minutes, and then at 350° C. for 60 minutes to have a polyimide, without changes in the pattern. Further, on another silicon wafer was formed a coating film with a thickness of 20 μm and the film was cured by the above conditions without forming any pattern.

When the cured film was peeled off from the wafer, it could be found that a tough polyimide film could be obtained. Also, a weight decrease-initiating temperature under heating of the film was 400° C. or higher whereby it can be found that the film is also excellent in heat resistance.

Example 2
Synthesis of Polyamic Acid Resin

A polyamic acid resin solution (hereinafter abbreviated to as "PA-2") having the solid content of 25% was obtained in the same manner as in Example 1 except for changing 6-FDA to 4,4'-oxydiphthalic acid (ODPA) and reacting them with equivalent amounts.
Preparation of Photosensitive Resin Composition To 10 g of the above synthesized polyamic acid resin solution (PA-2) were added 3 g of 1-(3,4-dimethoxy-6-nitrophenyl)ethyl-N-cyclohexylcarbamate and 0.5 g of polyethyleneglycol, and the mixture was dissolved while stirring, followed by filtration with a 5 μm filter to have a photosensitive resin composition.
Evaluation A silicon wafer was spin-coated with the thus prepared photosensitive resin composition, and prebaked at 100° C. for 300 seconds to have a uniform film having a thickness of 5 μm. Then, the film was irradiated with an ultrahigh pressure mercury lamp (20 mW/cm$^2$) for 100 seconds through a mask. The film was then dipped in water to carry out a development, rinsed with water, and dried so that a positive type clear relief pattern having a high resolution was obtained. The relief pattern was thermally cured at 100° C. for 30 minutes, at 200° C. for 60 minutes, and then at 350° C. for 60 minutes to have a polyimide, without changes in the pattern. Further, on another silicon wafer was formed a coating film with a thickness of 20 μm and the film was cured by the above conditions without forming any pattern.

When the cured film was peeled off, it could be found that a tough polyimide film could be obtained. Also, a weight decrease-initiating temperature under heating of the film was 400° C. or higher whereby it can be found that the film is also excellent in heat resistance.

Example 3
Synthesis of Polyamic Acid Resin

A polyamic acid resin solution (hereinafter abbreviated to as "PA-3") having the solid content of 25% was obtained in the same manner as in Example 1 except for changing DDE to methaphenylenediamine (hereinafter abbreviated to as "MPD") and 6-FDA to pyrromellitic acid dianhydride (PMDA) and reacting them with equivalent amounts.
Preparation of Photosensitive Resin Composition To 10 g of the above synthesized polyamic acid resin solution (PA-3) were added 3 g of 1-(3,4-dimethoxy-6-nitrophenyl)ethyl-N-cyclohexylcarbamate and 0.5 g of polyethyleneglycol, and the mixture was dissolved while stirring, followed by filtration with a 5 μm filter to have a photosensitive resin composition.
Evaluation A silicon wafer was spin-coated with the thus prepared photosensitive resin composition, and prebaked at 100° C. for 300 seconds to have a uniform film having a thickness of 5 μm. Then, the film was irradiated with an ultrahigh pressure mercury lamp (20 mW/cm$^2$) for 100 seconds through a mask. The film was then dipped in water to carry out a development, rinsed with water, and dried so that a positive type clear relief pattern having a high resolution was obtained. The relief pattern was thermally cured at 100° C. for 30 minutes, at 200° C. for 60 minutes, and then at 350° C. for 60 minutes to have a polyimide, without changes in the pattern. Further, on another silicon wafer was formed a coating film with a thickness of 20 μm and the film was cured by the above conditions without forming any pattern. When the cured film was peeled off, it could be found that a tough polyimide film could be obtained. Also, a weight decrease-initiating temperature under heating of the film was 400° C. or higher whereby it can be found that the film is also excellent in heat resistance.

Example 4
Synthesis of Polyamic Acid Resin

A polyamic acid resin solution (hereinafter abbreviated to as "PA-4") having the solid content of 25% was obtained in the same manner as in Example 1 except for changing DDE to 4,4'-diaminodiphenylsulfone (hereinafter abbreviated to as "p-DDS") and 6-FDA to 3,3',4,4'-biphenyltetracarboxylic acid dianhydride (s-BPDA) and reacting them with equivalent amounts.

Preparation of Photosensitive Resin Composition

To 10 g of the above synthesized polyamic acid resin solution (PA-4) were added 3 g of 1-(2-nitrophenyl)ethyl-N-cyclohexylcarbamate and 0.5 g of polyethyleneglycol, and the mixture was dissolved while stirring, followed by filtration with a 5 μm filter to have a photosensitive resin composition.

Evaluation

A silicon wafer was spin-coated with the thus prepared photosensitive resin composition, and prebaked at 100° C. for 300 seconds to have a uniform film having a thickness of 5 μm. Then, the film was irradiated with an ultrahigh pressure mercury lamp (20 mW/cm$^2$) for 100 seconds through a mask. The film was then dipped in water to carry out a development, rinsed with water, and dried so that a positive type clear relief pattern having a high resolution was obtained. The relief pattern was thermally cured at 100° C. for 30 minutes, at 200° C. for 60 minutes, and then at 350° C. for 60 minutes to have a polyimide, without changes in the pattern. Further, on another silicon wafer was formed a coating film with a thickness of 20 μm and the film was cured by the above conditions without forming any pattern. When the cured film was peeled off, it could be found that a tough polyimide film could be obtained. Also, a weight decrease-initiating temperature under heating of the film was 400° C. or higher whereby it can be found that the film is also excellent in heat resistance.

Example 5
Synthesis of Polyamic Acid Resin

A polyamic acid resin solution (hereinafter abbreviated to as "PA-4") having the solid content of 25% was obtained in the same manner as in Example 4.

Preparation of Photosensitive Resin Composition

To 10 g of the above synthesized polyamic acid resin solution (PA-4) were added 3 g of 1-(3,4-dimethoxy-6-nitrophenyl)ethyl-N-2-hydroxyethyl carbamate and 0.5 g of polyethyleneglycol, and the mixture was dissolved while stirring, followed by filtration with a 5 μm filter to have a photosensitve resin composition.

Evaluation

A silicon wafer was spin-coated with the thus prepared photosensitive resin composition, and prebaked at 100° C. for 300 seconds to have a uniform film having a thickness of 5 μm. Then, the film was irradiated with an ultrahigh pressure mercury lamp (20 mW/cm$^2$) for 100 seconds through a mask. The film was then dipped in water to carry out a development, rinsed with water, and dried so that a positive type clear relief pattern having a high resolution was obtained. The relief pattern was thermally cured at 100° C. for 30 minutes, at 200° C. for 60 minutes, and then at 350° C. for 60 minutes to have a polyimide, without changes in the pattern. The resolution of this relief pattern was higher than that of the relief pattern in Example 4. Further, on another silicon wafer was formed a coating film with a thickness of 20 μm and the film was cured by the above conditions without forming any pattern. When the cured film was peeled off, it could be found that a tough polyimide film could be obtained. Also, a weight decrease-initiating temperature under heating of the film was 400° C. or higher whereby it can be found that the film is also excellent in heat resistance.

The photosensitive resin composition of the present invention can easily be prepared without complex steps and contamination with ionic impurities. Also, it hardly affects the environment since water can be used as a developer. Furthermore, the photosensitive resin composition of the present invention has a high image-forming ability, film property and heat-resistance.

What is claimed is:

1. A positive-type photosensitive resin composition, which is developable solely with water, which comprises an alkali-soluble polymer (A) having a carboxyl group and a compound (B) which forms an amine compound with irradiation of light, wherein the alkali-soluble polymer (A) is a polyamic acid resin having recurring units represented by the formula (I):

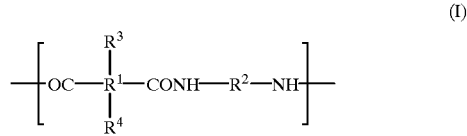

wherein $R^1$ represents a tetravalent group selected from the group consisting of:

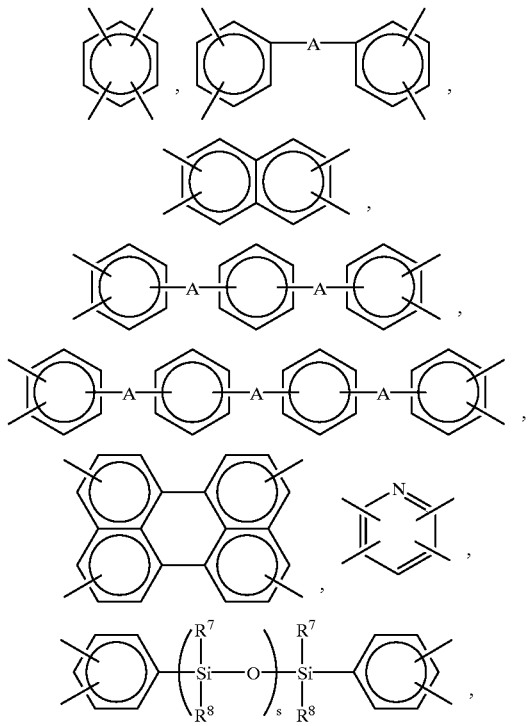

-continued

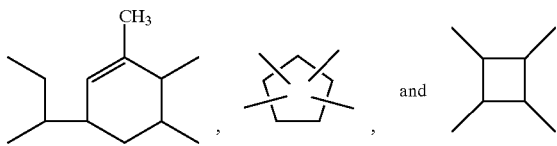

wherein A represents a member selected from the group consisting of

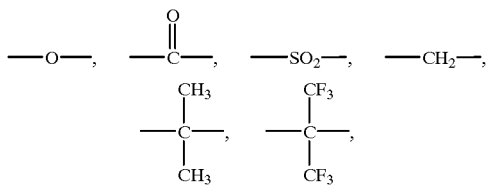

sulfur atom and a direct linkage with the proviso that each A represent the same member or represent a different member in the tetravalent group, $R^7$ and $R^8$ represent the same groups or represent different groups from each other and each represents an alkyl group having 1 to 10 carbon atoms, a cycloalkyl group having 3 to 8 carbon atoms, an aryl group having 6 to 14 carbon atoms or an aralkyl group having 7 to 17 carbon atoms, and s represents 0 or an integer of 1 or more, wherein aromatic rings of said tetravalent groups may have one or more substituents selected from the group consisting of alkyl groups having 1 to 6 carbon atoms and alkoxy groups having 1 to 6 carbon atoms; $R^2$ represents a divalent group selected from the group consisting of:

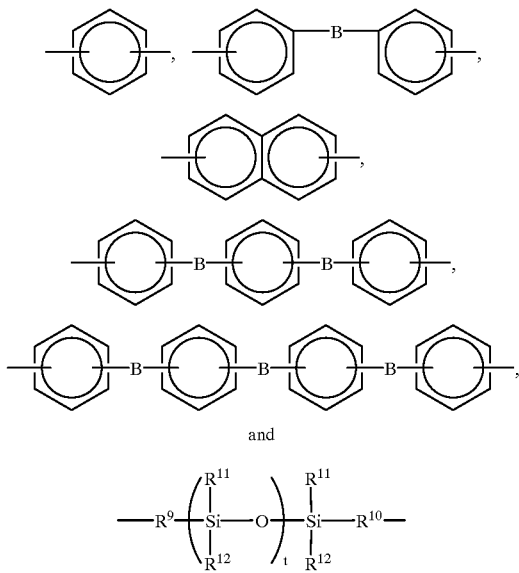

wherein B has the same meaning as A with the proviso that each B represents the same member or represents a different member in the divalent group, $R^9$ and $R^{10}$ may be the same groups or may be different groups from each other and each represents an alkylene group having 1 to 10 carbon atoms, a cycloalkylene group having 3 to 8 carbon atoms, an arylene group having 6 to 14 carbon atoms or an aralkylene group having 7 to 17 carbon atoms, $R^{11}$ and $R^{12}$ may be the same groups or may be different groups from each other and each represents an alkyl group having 1 to 10 carbon atoms, a cycloalkyl group having 3 to 8 carbon atoms, an aryl group having 6 to 14 carbon atoms or an aralkyl group having 7 to 17 carbon atoms, and t represents an integer of 1 or more, wherein an aromatic ring in said divalent group may have one or more substituents selected from the group consisting of an alkyl group having 1 to 6 carbon atoms, an alkoxy group having 1 to 6 carbon atoms and a hydroxyl group; $R^3$ and $R^4$ are in the ortho-position of one or two carbonyl group, respectively, and each independently represents a hydrogen atom or a carboxyl group, provided that at least one of $R^3$ and $R^4$ is a carboxyl group and wherein the compound (B) is a compound represented by the formula:

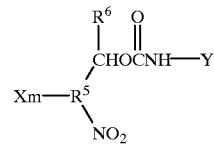

wherein $R^5$ represents an aromatic ring group; $R^6$ represents a hydrogen atom or an alkyl group having 1 to 6 carbon atoms; X represents an alkyl group having 1 to 10 carbon atoms, an alkoxyl group having 1 to 10 carbon atoms, a halogen atom, a nitro group or a cyano group; Y represents an alkyl group having 1 to 10 carbon atoms, a cycloalkyl group having 3 to 8 carbon atoms, an aralkyl group having 7 to 17 carbon atoms or a hydroxyalkyl group having 1 to 10 carbon atoms; m represents an integer of 1 through 5 and when m is 2 or more, each X may be the same group or may be a different group.

2. The photosensitive resin composition according to claim 1, wherein, the alkali-soluble polymer (A) has a number average molecular weight of 3,000 to 200,000.

3. The photosensitive resin composition according to claim 1, wherein the polyamic acid resin is a reaction product of a tetracarboxylic dianhydride and a diamine.

4. The photosensitive resin composition according to claim 3, wherein the tetracarboxylic dianhydride comprises, as part of an acid component, an aromatic tetracarboxylic dianhydride represented by the formula:

(III)

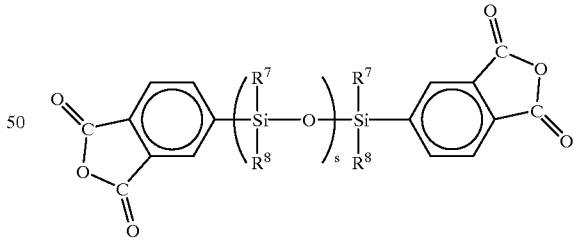

wherein $R^7$ and $R^8$ may be the same groups or may be different groups from each other and each represents an alkyl group having 1 to 10 carbon atoms, a cycloalkyl group having 3 to 8 carbon atoms, an aryl group having 6 to 14 carbon atoms or an aralkyl group having 7 to 17 carbon atoms; and s represents 0 or an integer of 1 or more.

5. The photosensitive resin composition according to claim 3, wherein the tetracarboxylic dianhydride comprises, as part of an acid component, at least one of alicyclic tetracarboxylic dianhydrides represented by the formulae (IV):

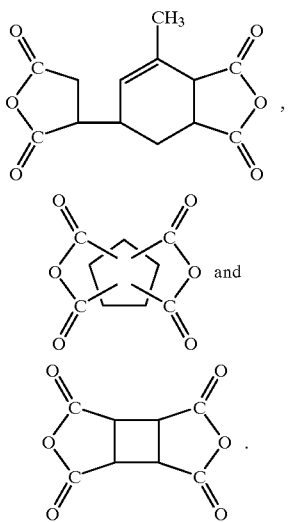

6. The photosensitive resin composition according to claim 3, wherein the diamine comprises, as part of an amine component, a diamino compound represented by the formula:

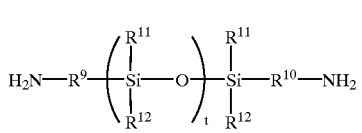

wherein $R^9$ and $R^{10}$ may be the same or different from each other and each represents an alkylene group having 1 to 10 carbon atoms, a cycloalkylene group having 3 to 8 carbon atoms, an arylene group having 6 to 14 carbon atoms or an aralkylene group having 7 to 17 carbon atoms, $R^{11}$ and $R^{12}$ may be the same or different from each other and each represents an alkyl group having 1 to 10 carbon atoms, a cycloalkyl group having 3 to 8 carbon atoms, an aryl group having 6 to 14 carbon atoms or an aralkyl group having 7 to 17 carbon atoms; and t represents an integer of 1 or more, or a diamino compound which is a hydrogenated compound of the formula (V).

7. The photosensitive resin composition according to claim 3, wherein the diamine is a hydroxyl group-containing diamine compound.

8. The photosensitive resin composition according to claim 3, wherein the tetracarboxylic acid anhydride is at least one selected from the group consisting of pyrromellitic dianhydride, 3,3',4,4'-benzophenonetetracarboxylic dianhydride 3,3',4,4'-biphenyltetracarboxylic dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 1,4,5,8-naphthalenetetracarboxylic dianhydride, 3,4,9,10-perylenetetracarboxylic dianhydride, 4,4'-sulfonyldiphthalic dianhydride, m-terphenyl-3,3'',4,4''-tetracarboxylic dianhydride, p-terphenyl-3,3'',4,4''-tetracarboxylic dianhydride, 4,4'-oxydiphthalic anhydride, 1,1,1,3,3,3-hexafluoro-2,2-bis(2,3- or 3,4-dicarboxyphenyl) propane dianhydride, 2,2-bis(2,3- or 3,4-dicarboxyphenyl) propane dianhydride, 2,2,-bis[4-(2,3- or 3,4-dicarboxyphenoxy)phenyl]propane dianhydride, and 1,1,1,3,3,3-hexafluoro-2,2-bis[4-(2,3- or 3,4-dicarboxyphenoxy)phenyl]propane dianhydride.

9. The photosensitive resin composition according to claim 3, wherein the diamine is at least one selected from the group consisting of p-phenylenediamine, m-phenylenediamine, p-xylylenediamine, m-xylylenediamine, 1,5-diaminonaphthalene, 3,3'-dimethylbenzidine, 3,3'-dimethoxybenzidine, 4,4'- (or 3,4'-, 3,3'-, 2,4'- or 2,2'-) diaminodiphenyl methane, 4,4'-(or 3,4'-, 3,3'-, 2,4'- or 2,2'-) diaminodiphenyl ether, 4,4'-(or 3,4'-, 3,3'-, 2,4'- or 2,2'-) diaminodiphenylsulfone, 4,4'-(or 3,4'-, 3,3'-, 2,4'- or 2,2'-) diaminodiphenylsulfide, 4,4',-benzophenonediamine, 4,4'-di(4-aminophenoxy)phenylsulfone, 1,1,1,3,3,3-hexafluoro-2,2-bis(4-aminophenyl)propane, 2,2-bis[4-(4-aminophenoxy)phenyl]propane, 3,3'-dimethyl-4,4'-diaminodiphenylmethane, 3,3',5,5'-tetramethyl-4,4'-diaminodiphenylmethane, 4,4'-di(3-aminophenoxy)phenylsulfone, 3,3'-diaminodiphenylsulfone and 2,2-bis(4-aminophenyl)propane.

10. The photosensitive resin composition according to claim 1, wherein $R^5$ is a benzene, naphthalene or anthracene ring.

11. The photosensitive resin composition according to claim 1, wherein the compound (B) is a compound selected from the group consisting of:

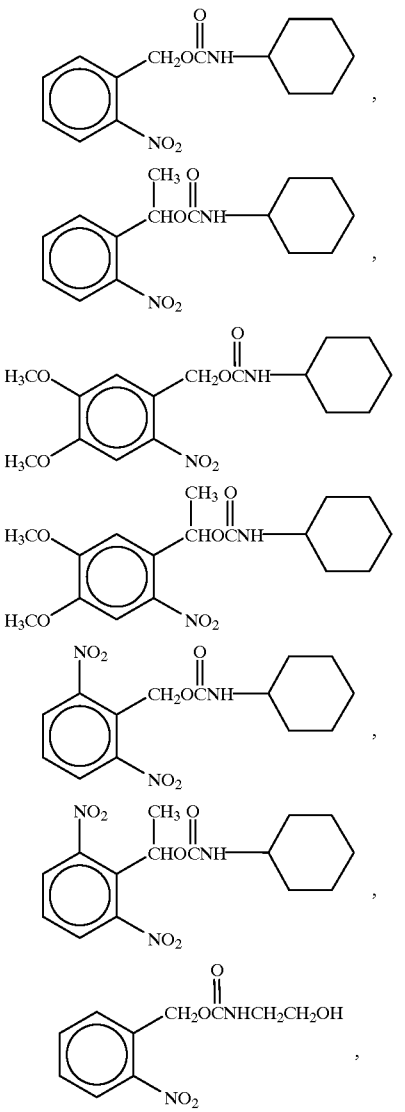

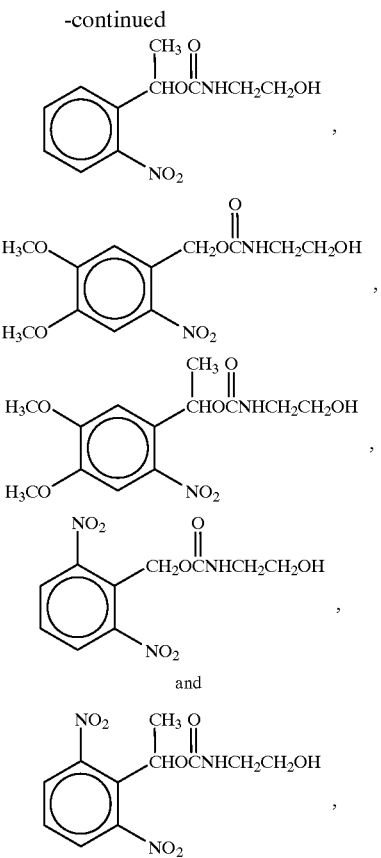

12. The photosensitive resin composition according to claim 11, wherein a alkali-soluble polymer (A) is a polyamic acid resin which is a reaction product of a tetracarboxylic anhydride and a diamine, wherein the tetracarboxylic acid anhydride is at least one selected from the group consisting of pyrromellitic dianhydride, 3,3',4,4'-benzophenonetetracarboxylic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 1,4,5,8-naphthalenetetracarboxylic dianhydride, 3,4,9,10-perylenetetracarboxylic dianhydride, 4,4'-sulfonyldiphthalic dianhydride, m-terphenyl-3,3",4,4"-tetracarboxylic dianhydride, p-terphenyl-3,3",4,4"-tetracarboxylic dianhydride, 4,4'-oxydiphthalic anhydride, 1,1,1,3,3,3-hexafluoro-2,2-bis(2,3- or 3,4-dicarboxyphenyl)propane dianhydride, 2,2-bis(2,3- or 3,4-dicarboxyphenyl)propane dianhydride, 2,2-bis[4-(2,3- or 3,4-dicarboxyphenoxy)phenyl]propane dianhydride, and 1,1,1,3,3,3-hexafluoro-2,2-bis[4-(2,3- or 3,4-dicarboxyphenoxy)phenyl]propane dianhydride and the diamine is at least one selected from the group consisting of p-phenylenediamine, m-phenylenediamine, p-xylylenediamine, m-xylylenediamine, 1,5-diaminonaphthalene, 3,3'-dimethylbenzidine, 3,3'-dimethoxybenzidine, 4,4'- (or 3,4'-, 3,3'-, 2,4'- or 2,2'-)diaminodiphenylmethane, 4,4'- (or 3,4'-, 3,3'-, 2,4'- or 2,2'-)diaminodiphenyl ether, 4,4'- (or 3,4'-, 3,3'-, 2,4'- or 2,2'-)diaminodiphenylsulfone, 4,4'- (or 3,4'-, 3,3'-, 2,4'- or 2,2'-)diaminodiphenylsulfide, 4,4'-benzophenonediamine, 4,4'-di(4-aminophenopxy)phenylsulfone, 1,1,1,3,3,3-hexafluoro-2,2-bis(4-aminophenyl)propane, 2,2-bis[4-(4-aminophenoxy)phenyl]propane, 3,3'-dimethyl-4,4'-diaminodiphenylmethane, 3,3',5,5'-tetramethyl-4,4'-diaminodiphenylmethane, 4,4'-di(3-aminophenoxy)phenylsulfone, 3,3'-diaminodiphenylsulfone and 2,2-bis(4-aminophenyl)propane.

13. The photosensitive resin composition according to claim 1, which comprises 1 to 250% by weight of the compound (B) based on the polymer (A).

14. The photosensitive resin composition according to claim 1, wherein an alkali-soluble polymer (A) is a polyamic acid resin which is a reaction product of a tetracarboxylic anhydride and a diamine.

15. The photosensitive resin composition according to claim 14, wherein the tetracarboxylic acid anhydride is at least one selected from the group consisting of pyrromellitic dianhydride, 3,3',4,4'-benzophenonetetracarboxylic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 2,3,5,6,-pyridinetetracarboxylic dianhydride, 1,4,5,8-naphthalenetetracarboxylic dianhydride, 3,4,9,10-perylenetetracarboxylic dianhydride, 4,4'-sulfonyldiphthalic dianhydride, m-terphenyl-3,3",4,4"-tetracarboxylic dianhydride, p-terphenyl-3,3",4,4"-tetracarboxylic dianhydride, 4,4'-oxydiphthalic anhydride, 1,1,1,3,3,3-hexafluoro-2,2-bis(2,3- or 3,4-dicarboxyphenyl)propane dianhydride, 2,2-bis(2,3- or 3,4-dicarboxyphenyl)propane dianhydride, 2,2-bis[4-(2,3- or 3,4-dicarboxyphenoxy)phenyl]propane dianhydride, and 1,1,1,3,3,3-hexafluoro-2,2-bis[4-(2,3- or 3,4-dicarboxypehnoxy)phenyl]propane dianhydride.

16. The photosensitive resin composition according to claim 14, wherein the diamine is at least one selected from the group consisting of p-phenylenediamine, m-phenylenediamine, p-xylylenediamine, m-xylylenediamine, 1,5-diaminonaphthalene, 3,3'-dimethylbenzidine, 3,3'-dimethoxybenzidine, 4,4'- (or 3,4'-, 3,3'-, 2,4'- or 2,2'-)diaminodiphenylmethane, 4,4'- (or 3,4'-, 3,3'-, 2,4'- or 2,2'-)diaminodiphenyl ether, 4,4'- (or 3,4'-, 3,3'-, 2,4'- or 2,2'-)diaminodiphenylsulfone, 4,4'- (or 3,4'-, 3,3'-, 2,4'- or 2,2'-)diaminodiphenylsulfide, 4,4'-benzophenonediamine, 4,4'-di(4-aminophenoxy)phenylsulfone, 1,1,1,3,3,3-hexafluoro-2,2-bis(4-aminophenyl)propane, 2,2-bis(4-aminophenoxy)phenyl]propane, 3,3'-dimethyl-4,4'-diaminodiphenylmethane, 3,3',5,5'-tetramethyl-4,4'-diaminodiphenylmethane, 4,4'-di(3-aminophenoxy)phenylsulfone, 3,3'-diaminodiphenylsulfone and 2,2-bis(4-aminophenyl)propane.

* * * * *